(12) United States Patent
Yee

(10) Patent No.: US 7,415,647 B2
(45) Date of Patent: Aug. 19, 2008

(54) TEST MODE FOR PIN-LIMITED DEVICES

(75) Inventor: Philip W. Yee, Los Altos, CA (US)

(73) Assignee: Micrel, Incorporated, San Jose, CA (US)

( * ) Notice: Subject to any disclaimer, the term of this patent is extended or adjusted under 35 U.S.C. 154(b) by 342 days.

(21) Appl. No.: 11/278,942

(22) Filed: Apr. 6, 2006

(65) Prior Publication Data

US 2007/0255984 A1    Nov. 1, 2007

(51) Int. Cl.
    *G01R 31/28*    (2006.01)
(52) U.S. Cl. ...................................... 714/734
(58) Field of Classification Search ............... 714/734, 714/724
    See application file for complete search history.

(56) References Cited

U.S. PATENT DOCUMENTS 5,414,861 A * 5/1995 Horning ..................... 365/229
5,965,997 A * 10/1999 Alwardi et al. .............. 320/132
7,026,855 B2 * 4/2006 Sueoka et al. ................ 327/333
2006/0132111 A1 * 6/2006 Jacobs et al. ................ 323/282

* cited by examiner

Primary Examiner—James C Kerveros
(74) Attorney, Agent, or Firm—Bever, Hoffman & Harms, LLP; Patrick T. Bever

(57) ABSTRACT

A pin-limited device includes a pattern-recognition circuit that detects a predetermined signal pattern transmitted on a supply pin of the device. The predetermined signal pattern is generated within the acceptable operating voltage range of the IC device (e.g., between the minimum and maximum acceptable system voltage levels utilized to control the internal circuitry of the device). Accordingly, the pin-limited IC device continues to operate within specifications while the predetermined signal pattern is transmitted on the selected power supply pin or pins. A test mode circuit generates a switch control signal in response to the predetermined signal pattern to connect an output pin of the device, for example, to an internal node of the device. The pattern recognition circuit sets a latch when the predetermined signal pattern is detected, and the latch is reset when the device is powered down then powered up.

12 Claims, 3 Drawing Sheets

TEST MODE FOR PIN-LIMITED DEVICES

FIELD OF THE INVENTION

This invention relates to integrated circuit (IC) devices, and in to IC devices including test mode control circuitry.

BACKGROUND OF THE INVENTION

FIG. 6 is a perspective view showing a temperature sensing device 10, which is an example of a pin-limited IC device. Temperature sensing device 10 is housed in a standard three-pin IC package including power/ground pins 11 and 12, and output 13 that extend from a package substrate 14. An IC chip 15, which is fabricated using known photolithographic (e.g., CMOS) fabrication techniques, is mounted on the package substrate 14 such that external nodes of IC chip 15 are electrically connected to pins 11, 12 and 13. A protective cover 16 is mounted on package substrate 14 over IC chip extending from a package substrate. Temperature sensing device 10 is thus a fully packaged device that is included in (e.g. soldered to) a host system (not shown), for example, by way of a printed circuit board. During operation, temperature sensing device 10 receives a high voltage supply from the host system on voltage supply pin 11, and a low voltage supply on ground pin 12 during normal operation. Temperature sensing device 10 asserts a (e.g., high) output signal on output pin 13 when temperature sensing device 10 (and, hence, the host system) is exposed to a predetermined temperature (e.g., 65° C.). While temperature sensing device 10 remains below the predetermined temperature, the output signal generated on output pin 13 remains de-asserted (e.g., low).

FIG. 7 is a block diagram showing functional components of temperature sensing device 10. Temperature sensing device 10 generally includes a sensor circuit 20 that generates a sensor signal $V_{SENSOR}$ on an internal node A whose voltage level is determined by a sensed temperature, a reference generator (e.g., bandgap) circuit 22 for generating a predetermined reference signal $V_{REF}$ on an internal node B representing the predetermined temperature, a comparator 24 for comparing the temperature and reference signals, for generating an appropriate output signal $V_{OUT}$ on output pin 13. Comparator 24 generates a low output signal $V_{OUT}$ when, for example, the voltage level of sensor signal $V_{SENSOR}$ is less than reference signal $V_{REF}$, and generates a high output signal $V_{OUT}$ when the voltage level of sensor signal $V_{SENSOR}$ is greater than reference signal $V_{REF}$.

Like all ICs, it is desirable for a manufacturer to test temperature sensing device devices in order to verify that they operate as intended prior to assembly in a host system. One conventional temperature sensing device testing procedure involves placing the temperature sensing device devices in a temperature-controlled apparatus, and measuring the devices' responses to various ambient temperatures. A problem with this approach is that the use of temperature-controlled apparatus is time consuming and expensive, and does not facilitate access to internal nodes of the temperature sensing device, which may be necessary to troubleshoot and identify the source of design or fabrication errors. A second conventional testing procedure avoids the problems associated with the use of temperature-controlled apparatus by simulating the test temperatures using appropriate voltage signals applied to selected internal nodes of the temperature sensor, and/or by reading signals generated at internal nodes (e.g., nodes A and B) in response to applied stimuli. By accessing an internal node, one can electrically mimic temperature cycling and thus test the part quickly and efficiently at a single temperature, possibly room temperature. However, in general, accessing the internal nodes of a pin-limited IC device requires suspending normal operation, and putting the device into a test mode in which signals may be passed to or read from selected internal nodes (e.g., sensor signal $V_{SENSOR}$ from node A, or reference voltage $V_{REF}$ from node B; see FIG. 7) from one of the external pins. Because the power supply pins (e.g., power supply pin 11 and ground pin 12) are required to power temperature sensing device 10 during both normal and test mode operations, the only external pin that can be utilized to pass signals to or from selected internal nodes is output pin 13. Moreover, the mechanism for entering the test mode is preferably performed by applying a signal to one or more existing external pins, which for the reasons provided above typically requires the use of output pin 13. However, the signal used to switch temperature sensing device 10 into the test mode must be selected such that the signal is not accidentally applied to output pin 13 during normal operation (or else the temperature sensing device 10 may inadvertently enter the test mode and fail to perform as expected). For devices having a multitude of pins, one can easily inject a signal into a dedicated pin that causes an internal signal to be routed out on another pin. Therefore, for pin-limited devices such as 3-pin temperature sensing device 10, the task of entering a test mode becomes non-trivial.

What is needed is a method for testing pin-limited IC devices that avoids the need for the addition of extra pins. In particular, what is needed is a test mode control circuit that is enabled in response to a signal applied to the external pins of a pin-limited IC device that would not occur during normal operation of the device.

SUMMARY OF THE INVENTION

The present invention is directed to a circuit and method for controlling a pin-limited IC device such that the device selectively switches from a normal operating mode to a test mode when a predetermined signal pattern is applied to at least one of the two power supply pins of the device. In particular, the present invention is directed to a test mode control circuit for a pin-limited IC device that detects a predetermined signal pattern (pulses) applied to the power supply pin or pins. The predetermined signal pattern is generated within the acceptable operating voltage range of the IC device (e.g., between the minimum and maximum acceptable system voltage levels utilized to control the internal circuitry of the device). Accordingly, the pin-limited IC device continues to operate within specifications while the predetermined signal pattern is transmitted on the power supply pin or pins. The predetermined signal pattern is preferably selected such that the test mode is entered only when a valid pulse train is detected, and the pulse train is selected such that the probability of the pulse train being inadvertently generated on the power supply pins during normal operating conditions (e.g., during power up) is acceptably low.

In one embodiment an IC device (e.g., a three-pin temperature sensing device) includes a functional circuit having one or more internal nodes and an output node, and a switch for selectively connecting either the internal node or the output node to an output pin of the device. The device also includes a test mode control circuit that utilizes a pattern recognition circuit to detect the predetermined signal pattern when it is transmitted onto the power supply pin of the device, and generates a switch control signal that causes the switch to disconnect the output pin from the output node of the functional circuit and to connect the output pin to the selected internal node when the predetermined signal pattern is detected. The test mode circuit also includes a latch that is set by the pattern recognition circuit when the predetermined signal pattern is detected, and a reset-on-power-up that resets the latch at power up.

In accordance with another embodiment of the present invention, a test system includes a power supply circuit for generating a power supply signal, a pulse signal generator for causing the power supply signal to include a predetermined signal pattern, and a control circuit for processing signals generated by a pin-limited IC device. The pin-limited IC device includes a power supply pin that is connected to receive the power supply signal, a signal that is connected to the control circuit, and functional and test mode circuits that operate in the manner described above. In accordance with yet another embodiment of the present invention, the test system applies the power supply signal in a steady state to the power supply pin of the pin-limited IC device, whereby the pin limited IC device enters a normal operating mode. Subsequently, the pulse signal generator causes the power supply signal to include the predetermined signal pattern, whereby the pin-limited IC device switches from the normal operating mode to the test mode.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in pin-limited IC devices. The following description is presented to enable one of ordinary skill in the art to make and use the invention as provided in the context of a particular application and its requirements. As used herein, the term "connected" is used herein to describe the substantially direct connection between two circuit components using, for example, a metal trace or wire, and is distinguished from the terms "coupled", which is used to indicate either a direct connection or an indirect connection by way of an intervening circuit component (e.g., a capacitor, inductor, resistor, transistor, or diode). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
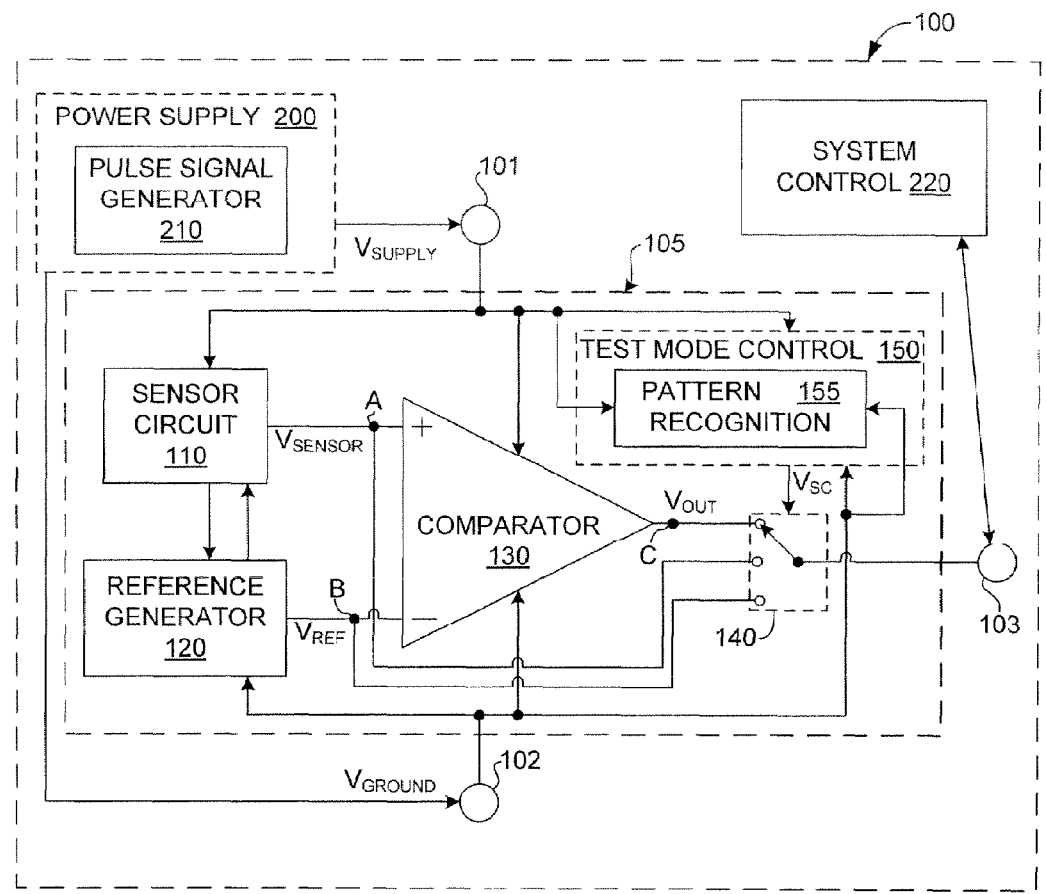
FIG. 1 is a block diagram showing a three-pin temperature sensing device according to an embodiment of the present invention.

FIG. 1 is a simplified block diagram illustrating a test system 100 for testing a 3-pin temperature sensing device 105, which represents an exemplary pin-limited IC device.

Figure 2:
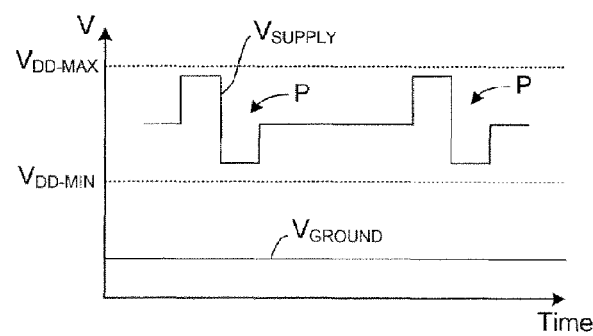
FIG. 2 is a timing diagram depicting exemplary predetermined signal patterns utilized to control the three-pin temperature sensing device according to an aspect of the present invention.

Test system 100 includes a power supply circuit 200 and a system control circuit 220. Power supply circuit 200 generates (supplies) a (high) supply voltage $V_{SUPPLY}$ and a ground (low) supply voltage $V_{GROUND}$ that are utilized to power and control temperature sensing device 105 in the manner described below. As indicated in FIG. 2, supply voltage $V_{SUPPLY}$ is maintained between a predetermined minimum supply voltage level $V_{DD-MIN}$ and a predetermined maximum supply voltage level $V_{DD-MAX}$ relative to a fixed ground voltage $V_{GROUND}$. Those skilled in the art will recognize that such supply voltage ranges are specified by the manufacturer of IC devices, such as 3-pin temperature sensing device 105, as being required for normal (expected) operation of the IC device. In accordance with an aspect of the present invention, power supply circuit 200 includes a pulse signal generator 210 that selectively causes supply voltage $V_{SUPPLY}$ to include a predetermined signal (pulse) pattern in the manner described below. Test system 100 also includes a system control circuit 220 for transmitting control signals to or receiving signals from temperature sensing device 105. Test system 100 is generally constructed in accordance with known techniques.

Figure 6:
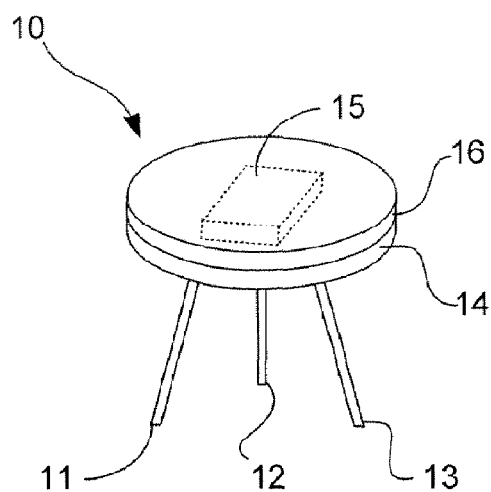
FIG. 6 is a perspective side view showing an IC device housed in a standard three-pin package.
Figure 7:
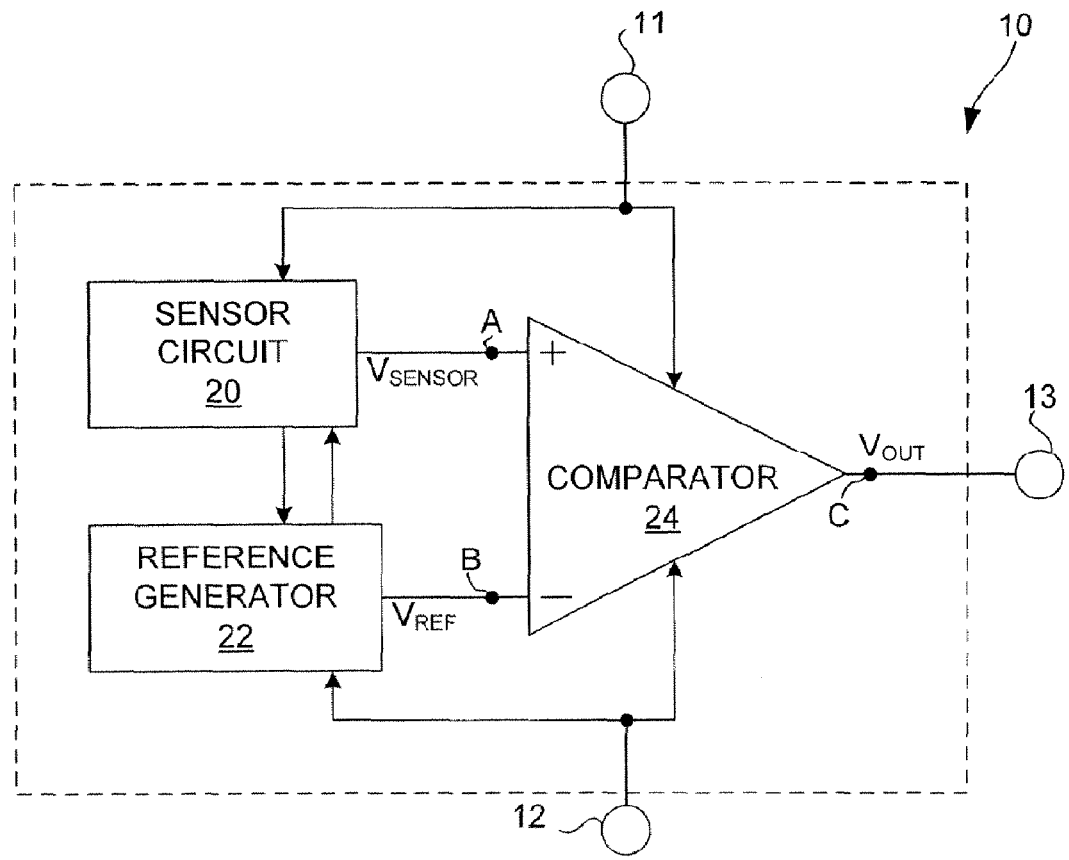
FIG. 7 is a block diagram showing a conventional three-pin temperature sensing device.

Temperature sensing device 105 is connected into test system 100 in the manner indicated in FIG. 1. Similar to conventional temperature sensing devices (discussed above), temperature sensing device 105 is fabricated on an integrated circuit "chip" using known fabrication techniques, and is housing in a standard package (e.g., as shown in FIG. 6) having three external pins: a power supply pin 101 for receiving externally generated power supply signal $V_{SUPPLY}$, a ground pin 102 for receiving ground signal $V_{GROUND}$, and an output (signal) pin 103 for transmitting signals between temperature sensing device 105 and an external host circuit (e.g., system control circuit 220). Also similar to conventional temperature sensing devices, temperature sensing device 105 includes a functional circuit formed by a sensor circuit 110, a bandgap reference generator 120, a comparator 130, each of which are fabricated to operate as intended in response to power supply voltages $V_{SUPPLY}$ and $V_{GROUND}$. Sensor circuit 110 generates on an internal node A, in accordance with known techniques, a sensor signal $V_{SENSOR}$ having a voltage level that is proportional to an ambient temperature in which temperature sensing device 105 is located. Bandgap reference generator 120 generates a reference voltage $V_{REF}$ on an internal node B, also in accordance with known techniques, such that reference signal $V_{REF}$ has a predetermined (fixed) voltage level that is independent of the ambient temperature. Comparator 130 (e.g., an operational amplifier) compares sensor signal $V_{SENSOR}$ with reference signal $V_{REF}$, and generates output signal $V_{OUT}$ on a node C that is asserted (e.g., has a relatively high voltage level) when, for example, sensor signal $V_{SENSOR}$ is greater than reference signal $V_{REF}$, and is de-asserted (e.g., has a relatively low voltage level) when, for example, sensor signal $V_{SENSOR}$ drops below (becomes less than) reference signal $V_{REF}$.

In accordance with the present embodiment, temperature sensing device 105 includes an output switch 140 and a test mode control circuit 150 that cooperate to switch temperature sensing device 105 from a normal operating mode to a test mode.

Output switch 140 has a first input terminal 141 connected to internal node A, a second input terminal 142 connected to internal node B, a third input terminal connected to node C, and an output terminal connected to output pin 103. As indicated in FIG. 1, output switch 140 is controlled by a switch control signal $V_{SC}$, which is generated by test mode control circuit 150, to connect one of internal node A, internal node B, or node C to output pin 103. When temperature sensing device 105 is in the normal operating mode, switch 140 receives a first control signal that connects output pin 140 to output node C, whereby output signal $V_{OUT}$ is applied to output pin 103. When temperature sensing device 105 is in the test mode, switch 140 receives a second control signal that connects output pin 140 to one of internal nodes A and B, whereby one of sensor signal $V_{SENSOR}$ and reference signal $V_{REF}$ are applied to output pin 103.

In accordance with the present invention, test mode control circuit 150 includes a pattern recognition circuit 155 that is configured to detect a predetermined signal generated on power supply pin 101, where the signal is generated within the acceptable operating voltage of temperature sensing device 105. For example, as indicated in FIG. 2, if temperature sensing device 105 is fabricated such that it operates (i.e., is operably responsive to) a supply voltage $V_{SUPPLY}$ that is between a $V_{DD\text{-}MAX}$ voltage (e.g., 5 volts) and a $V_{DD\text{-}MIN}$ voltage (e.g., 2 volts), then supply voltage $V_{SUPPLY}$ is controlled by power supply/pulse signal generator 210 (see FIG. 1) to include intentionally generated pulses P that are spaced in accordance with the predetermined signal pattern and have a minimum voltage greater than 2 volts and a maximum voltage less than 5 volts. Specifically, supply voltage $V_{SUPPLY}$ is maintained between $V_{DD\text{-}MAX}$ and $V_{DD\text{-}MIN}$ while the predetermined signal pattern is being generated. Accordingly, temperature sensing device 105 continues to operate within specifications while the predetermined signal pattern is transmitted on power supply pin 101. Pattern recognition circuit 155 may require high/low thresholds that are skewed using known techniques in order to detect the predetermined signal pulses. The predetermined signal pattern is preferably selected such that the test mode is entered only when a valid pulse train is detected, and the pulse train is selected such that the probability of the pulse train being inadvertently generated on power supply pin 101 during normal operating conditions (e.g., during power up) is acceptably low.

Although the present invention depicts the predetermined signal pattern detected by test mode control circuit 150 as being transmitted on (high) power supply pin 101, those skilled in the art will recognize that such a signal pattern is generated between $V_{SUPPLY}$ and $V_{GROUND}$, and as such an equivalent signal pattern may be generated by manipulating $V_{GROUND}$.

Figure 3:
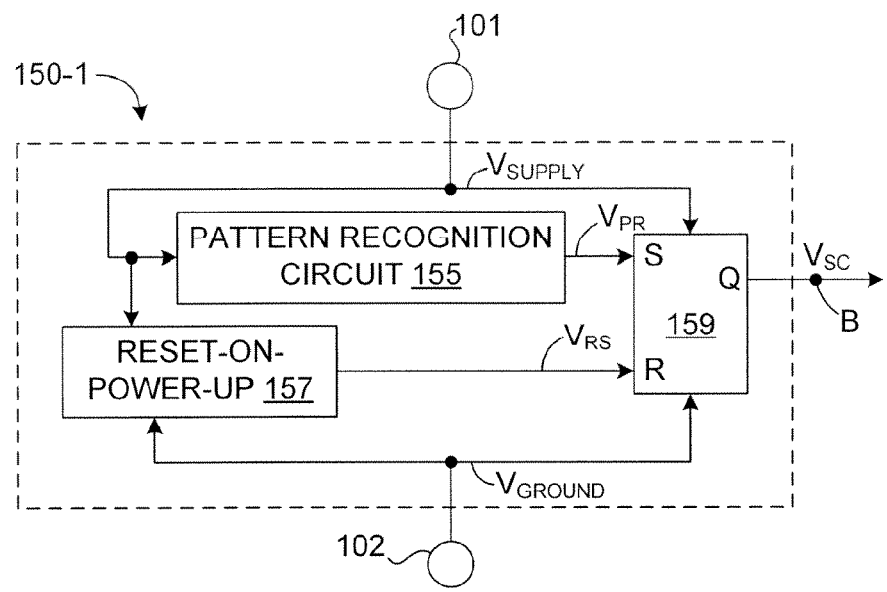
FIG. 3 is a block diagram showing a test mode control circuit of the temperature sensing device of FIG. 1 according to a specific embodiment of the present invention.

FIG. 3 is a block diagram showing test mode control circuit 150-1 in accordance with an embodiment of the present invention. Test mode control circuit 150-1 includes pattern recognition circuit 155, a reset-on-power-up circuit 157, and a latch 159. As indicated in FIG. 3, pattern recognition circuit 155 asserts a pattern recognized signal $V_{PR}$ when the predetermined signal pattern is transmitted onto power supply pin 101. Reset-on-power-up circuit 157 detects a power-up condition (i.e., an increase in $V_{SUPPLY}$ from below $V_{MIN}$ to above $V_{MIN}$; see FIG. 2) of temperature sensing device 105, and generates a reset signal $V_{RS}$ that is applied to a reset terminal of latch 159 when the power-up condition is detected. Latch 159 generates (asserts) switch control signal $V_{SC}$ when the pattern recognition circuit 155 detects the predetermined signal pattern (i.e., when pattern recognition signal $V_{PR}$ is asserted), and otherwise de-asserts switch control signal $V_{SC}$.

Thus, reset-on-power-up circuit 157 insures that latch 159 powers up in the inactive (de-asserted) state, so switching temperature sensing device 105 from test mode to normal operating mode is simply a matter of powering down and then powering up again.

Figure 4:
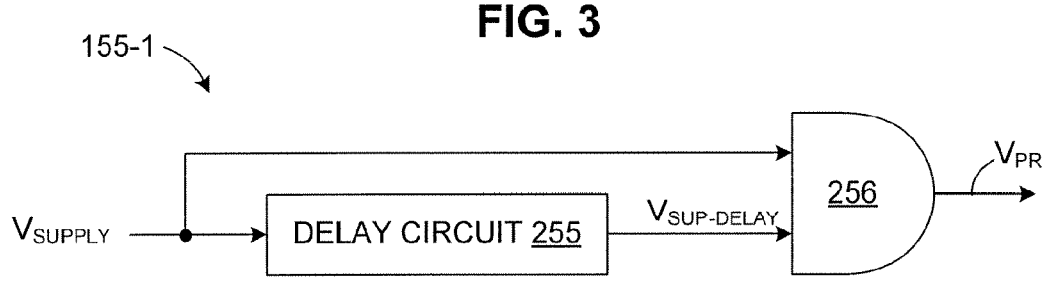
FIG. 4 is a block diagram showing a simplified pattern recognition circuit utilized in the test mode control circuit of FIG. 3 according to an exemplary specific embodiment of the present invention.
Figure 5A:
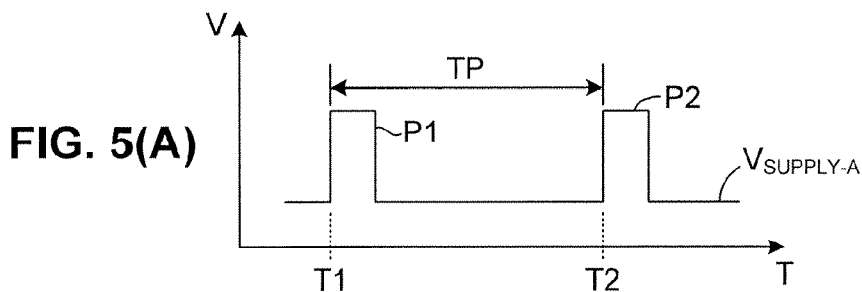
FIGS. 5(A) and 5(B) are timing diagrams depicting exemplary predetermined signal patterns detected by the pattern recognition circuit of FIG. 4.
Figure 5B:
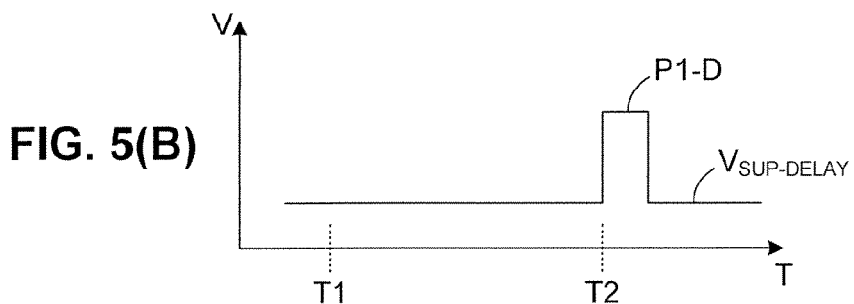

FIG. 4 is a simplified diagram showing a simplified pattern recognition circuit 155-1 in accordance with an embodiment of the present invention. Pattern recognition circuit 155-1 includes a delay circuit 255 having an input terminal connected to power supply pin 101, and a logic gate 256 including a first input terminal connected to power supply pin 101, a second input terminal connected to receive a supply-delay signal $V_{SUP\text{-}DELAY}$ from an output terminal of delay circuit 255, and an output terminal connected to transmit pattern recognized signal $V_{PR}$ to the set terminal of latch 159 (see FIG. 3). Pattern recognition circuit 155-1 is responsive to the supply voltage signal $V_{SUPPLY\text{-}A}$ shown in FIG. 5(A) to set latch 159, thereby causing temperature sensing device 105 to enter the test mode. In particular, as indicated in FIG. 5(A), supply voltage signal $V_{SUPPLY\text{-}A}$ is generated such that a first pulse P1 is separated from a second pulse P2 by a time period TP, and delay circuit 255 is fabricated to delay any signals received at its input terminal by the same time period TP. Accordingly, as indicated in FIGS. 5(A) and 5(B), supply-delay signal $V_{SUP\text{-}DELAY}$ shifts high in response to the delayed first pulse (P1-D) at the same time that supply voltage signal $V_{SUPPLY\text{-}A}$ shifts high in response to second pulse P2. With both supply voltage signal $V_{SUPPLY\text{-}A}$ and supply-delay signal $V_{SUP\text{-}DELAY}$ shifted high (i.e., at time T2 in FIGS. 5(A) and 5(B)), logic AND gate 256 generates a high output signal that is applied to the set terminal of latch 159 (FIG. 3), thereby causing latch 159 to assert switch control signal $V_{SC}$. Referring again to FIG. 1, the assertion of switch control signal $V_{SC}$ causes switch 140 to disconnect output node C from output pin 103, and to connect one of internal nodes A or B to output pin 103, thereby passing one of sensor signal $V_{SENSOR}$ or reference voltage $V_{REF}$ to system control circuit 230 for analysis.

Those skilled in the art will recognize that the simplified exemplary pattern recognition circuit described above may not provide sufficient immunity from accidental (unintentional) entry into the test mode during normal operation, and that a more complex pattern recognition circuit that is capable of detecting a more complex signal pattern may be required. Such relatively complex pattern recognition circuits can take many forms, and those skilled in the art will recognize that disclosing every possible pattern recognition circuit is impractical. Further, to control a multi-terminal switch such as switch 140 (see FIG. 1), those skilled in the art will recognize that a multi-stage pattern recognition circuit configured in a manner similar to that shown in FIG. 4 may be used to generate two or more control signals in response to different predetermined signal patterns. Moreover, in place of a combinatorial pattern recognition circuit, such as that described above with reference to FIG. 4, a pattern recognition circuit including a state machine may be used as well to switch between different test modes.

Although the present invention has been described with respect to certain specific embodiments, it will be clear to those skilled in the art that the inventive features of the present invention are applicable to other embodiments as well, all of which are intended to fall within tho scope of the present invention. For example, although the present invention is described above with specific reference to a three-pin temperature sensing circuit, the present invention may be utilized in any type of IC device having any number of external pins. Moreover, while the specific embodiments described above include switch 140 that selectively accesses internal nodes A and B for purposes of reading the voltage levels at these nodes, a similar switch may be utilized to access internal nodes of the functional circuit for purposes of introducing test voltages that, for example, mimic predetermined temperatures. In addition, switch 140 may be omitted entirely, and test voltages may be automatically generated "on-chip", for example, using a predetermined test sequence in response to entering the test mode.

The invention claimed is:

1. An integrated circuit device comprising:
    a power supply pin;
    an output pin;
    a functional circuit including a plurality of internal nodes and an output node;
    a switch having a first input terminal connected to a selected internal node of said plurality of internal nodes, a second input terminal connected to the output node, and an output terminal connected to the output pin; and
    a test mode control circuit for detecting a predetermined signal pattern is applied to said power supply pin, and for controlling the switch to disconnect the output pin from the output node of the functional circuit and to connect the output pin to the selected internal node when the predetermined signal pattern is detected.

2. The integrated circuit according to claim 1,
    wherein the functional circuit is operably responsive to a supply voltage provided on the power supply pin that is between a predetermined minimum voltage level and a predetermined maximum voltage level, and
    wherein the test mode control circuit includes a pattern recognition circuit for detecting the predetermined signal pattern in the supply voltage while the supply voltage is maintained between the predetermined minimum and maximum voltage levels of the supply voltage.

3. The integrated circuit according to claim 2, wherein the test mode control circuit further comprises means for generating a switch control signal when the pattern recognition circuit detects the predetermined signal pattern.

4. The integrated circuit according to claim 3, wherein said means for generating the switch control signal comprises a latch that is set when the pattern recognition circuit detects the predetermined signal pattern.

5. The integrated circuit according to claim 4, wherein said test mode control circuit further comprises means detecting a power up condition of the integrated circuit, and for resetting the latch when the power up condition is detected.

6. The integrated circuit according to claim 4, wherein said pattern recognition circuit comprises a delay circuit having an input terminal connected to the power supply pin, and a logic gate including a first input terminal connected to the power supply pin, a second input terminal connected to an output terminal of the delay circuit, and an output terminal connected to a set terminal of the latch.

7. The integrated circuit according to claim 1, wherein the function circuit comprises a sensor for generating a sensor signal at a first internal node, a reference signal generator for generating a reference signal at a second internal node, and a comparator for generating an output signal on said output node in response to the sensor signal and the reference signal.

8. The integrated circuit according to claim 7, wherein the selected internal node comprises one of said first internal node and said second internal node.

9. The integrated circuit according to claim 7,
    wherein the first input terminal of the switch is connected to the first internal node,
    wherein the switch further comprises a third input terminal connected to the second internal node, and
    wherein the test mode control circuit further comprises:
    means for detecting a first predetermined signal pattern applied to said power supply pin, and for controlling the switch to disconnect the output pin from the output node and to connect the output pin to the first internal node when the first predetermined signal pattern is detected, and
    means for detecting a second predetermined signal pattern applied to said power supply pin, and for controlling the switch to disconnect the output pin from the output node and to connect the output pin to the second internal node when the second predetermined signal pattern is detected.

10. A system comprising:
    a power supply circuit for generating a power supply signal such that the power supply signal is maintained between a predetermined minimum voltage level and a predetermined maximum voltage level;
    a pulse signal generator for causing the power supply signal to include a predetermined signal pattern;
    a control circuit; and
    an integrated circuit comprising:
    a power supply pin connected to receive the power supply signal;
    a signal pin connected to the control circuit;
    first means, operably responsive to the power supply signal, for generating a first output signal on the signal pin during a normal operating mode, and for generating a second output signal on the signal pin during a test mode; and
    second means for detecting the predetermined signal pattern, and for switching the first means from the normal operating mode to the test mode when the predetermined signal pattern is detected.

11. A method for testing a pin-limited integrated circuit, the method comprising:
    applying a power supply signal to a power supply pin of the pin-limited integrated circuit, wherein the power supply signal is maintained between a predetermined minimum voltage level and a predetermined maximum voltage level such that the pin-limited integrated circuit enters a normal operating mode;
    causing the power supply signal to include a predetermined signal pattern while maintaining the power supply signal between the predetermined minimum voltage level and the predetermined maximum voltage level.

12. A three-pin temperature sensing device comprising:
    a power supply pin;
    an output pin;
    a ground pin;
    a functional circuit including:
    a sensor circuit for generating a sensor signal on a first internal node,
    a reference generator circuit for generating a reference signal on a second internal node, and
    a comparator for generating a detection signal on an output node in response to the sensor signal and the reference signal;
    a switch having a first input terminal connected to one of the first internal node and the second internal node, a second input terminal connected to the output node, and an output terminal connected to the output pin; and
    a test mode control circuit for detecting a predetermined signal pattern applied to said power supply pin, and for disconnecting the output node from the output pin and connecting said one of the first internal node and the second internal node to the output pin when the predetermined signal pattern is detected.

* * * * *